Sept. 30, 1969 K. K. N. CHANG 3,470,375

HIGH FREQUENCY SEMICONDUCTOR SYSTEMS USING ELECTRIC FIELDS PERPENDICULAR TO THE DIRECTION OF WAVE PROPAGATION

Filed March 13, 1964

INVENTOR.
KERN K.N. CHANG
BY
Edward J. Norton
Attorney 3,470,375
Patented Sept. 30, 1969

3,470,375

HIGH FREQUENCY SEMICONDUCTOR SYSTEMS USING ELECTRIC FIELDS PERPENDICULAR TO THE DIRECTION OF WAVE PROPAGATION

Kern K. N. Chang, Princeton, N.J., assignor to RCA Corporation, a corporation of Delaware Filed Mar. 13, 1964, Ser. No. 351,669
Int. Cl. H04b 9/00
U.S. Cl. 250—199 7 Claims This invention relates to semiconductor signal translating systems for use with high frequency signals, and particularly to an improved semiconductor or solid-state signal translating system capable of amplification or modulation at frequencies including light wavelengths.

It is an object of the invention to provide an improved semiconductor signal translating system.

Another object is to provide an improved high frequency semiconductor system which operates in response to a received coherent-light wave in the presence of an applied direct current electric field to produce amplification or modulation of the coherent-light wave.

Briefly, in one embodiment of the invention described herein, a thin, semiconductor member of particular construction is provided. An electromagnetic signal in the form of a coherent-light wave or beam generated by a suitable source is directed to and through the semiconductor member, the semiconductor member being substantially transparent to the coherent-light wave. Suitable means are provided including ohmic contacts on the semiconductor member and a direct current (DC) source to apply a direct current electric field to the semiconductor member perpendicular to the propagation direction of the coherent-light wave. The coherent-light wave is polarized in a manner to cause the magnetic field of the coherent-light wave in the semiconductor member to be substantially perpendicular to the applied direct current electric field. The electric field of the coherent-light wave is, therefore, parallel to the applied direct current electric field.

Considering only the photon energy in the coherent-light wave which passes through the semiconductor member, the above outlined construction results in an amplification of the coherent-light wave. Further, the amount of amplification is a direct function of the intensity of the applied direct current electric field. The coherent-light wave can be modulated or otherwise processed in a desired manner by the proper control of the applied direct current electric field.

A more detailed description of the invention will now be given in connection with the attached drawing, in which.

Figure 1:
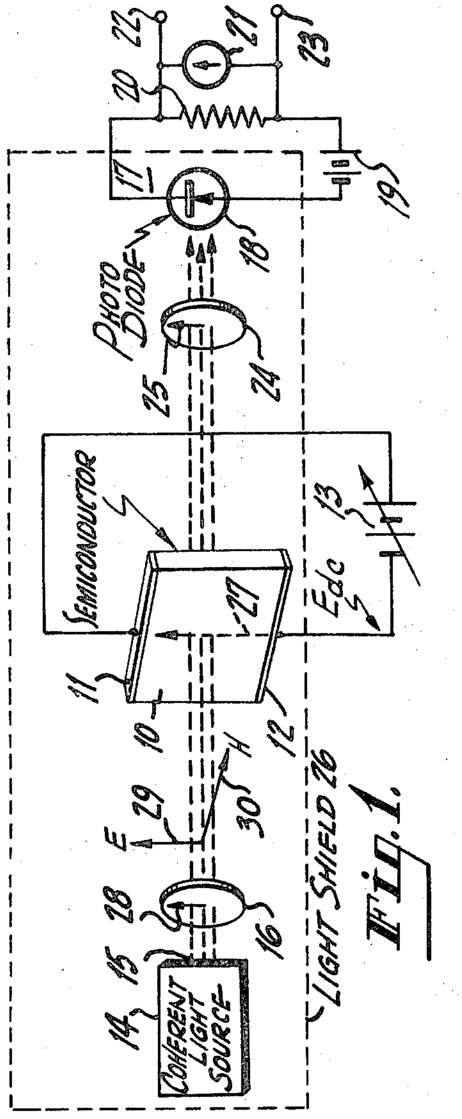
FIG. 1 is a schematic diagram of one embodiment of a semiconductor signal translating system constructed according to the invention.

A thin, rectangularly-shaped semiconductor member 10 is shown in FIG. 1. The member 10 is constructed of a semiconductor material, N-type gallium arsinide, for example, properly doped to provide an excess of free charge carriers or electrons in the case of the above-cited material. A pair of ohmic contacts 11, 12 constructed of indium, for example, are positioned on opposite edges of the member 10. A direct current source shown as a battery 13 is connected between the two ohmic contacts 11, 12. With the exception of the two edges upon which the contacts 11, 12 are positioned, the semiconductor member 10 is optically polished to reduce surface absorption of incident photon energy.

A coherent-light source 14 serves to generate a coherent-light wave or beam 15. The source 14 can be constructed in the manner of a neon-helium gas laser operated to produce a coherent, infrared light beam or any other suitable source of electromagnetic signal may be used. The coherent-light wave 15 is directed through a light polarizer 16 to the semiconductor member 10. That portion of the coherent-light wave 15 not reflected from the optically polished surface of the semiconductor member 10 passes through the semiconductor member 10 to a photosensitive detection system 17. The semiconductor member 10 is preferably made of a material which has a band gap energy level higher than that of the incident photon energy. Little, if any, injection of free charge carriers into the semiconductor member 10 by the incident photon energy takes place.

The photo-sensitive detection system 17 is shown by way of example as a series circuit including a semiconductor photo-diode 18, a direct current source or battery 19, and a load resistor 20. Alternatively, the photo-sensitive detection system 17 can include a photomultiplier tube, a photosensitive film recorder or other structure suited to the needs of a particular application. A second light polarizer 24 serves to polarize the coherent-light wave 15 in a manner to provide the maximum coupling of energy between the coherent-light beam 15 and the photo-diode 18. While a particular plane of polarization of the polarizer 24 is indicated by the arrow 25, the actual plane of polarization for the polarizer 24 employed in a given application can be other than that indicated by the arrow 25 so as to provide the maximum coupling of energy to the photo-diode 18. An oscilloscope or other test equipment 21 is connected across the load resistor 20 to measure or otherwise display the photo-current generated by the operation of the photo-diode 18. Depending upon the sensitivity of the photo-sensitive detection system 17, an amplifier, not shown, can be connected in series with the test equipment 21 across the resistor 20, if needed. A pair of output terminals 22, 23 are provided for applying the output signal derived across the resistor 20 to an amplifier or any desired utilization circuit.

In order to reduce the effect of spurious light waves on the operation of the embodiment shown in FIG. 1, a light shield 26 is indicated by dashed lines as enclosing the coherent-light source 14, the semiconductor member 10 and the photo-sensitive detection system 17. The light shield 26 can take the form of a box or similar structure lined with black cloth or other light absorbing material.

In the operation of the embodiment shown in FIG. 1, the ohmic contacts 11, 12 and the battery 13 serve to apply an electrical field $E_{dc}$ to the semiconductor member 10 in the direction of the arrow 27 perpendicular to the propagation direction of the coherent-light wave 15. A flow of the free charge carriers or electrons between the contacts 11, 12 takes place. The polarizer 16 acts in the plane of polarization indicated by the arrow 28 to establish the electric field E of the coherent-light beam 15, indicated by the arrow 29, parallel to the applied electric field $E_{dc}$, resulting in the magnetic field H of the coherent-light wave 15, indicated by the arrow 30, being perpendicular to the applied electric field $E_{dc}$. The important consideration is that the magnetic field in the semiconductor member 10 due to the coherent-light wave 15 be perpendicular to the applied electric field $E_{dc}$. When a source 14 is used including means providing accurate and controlled polarization of the coherent-light wave 15 in the manner shown in FIG. 1, the polarizer 16 can be removed. The polarizer 16 serves to ensure that a component of the electric field of the coherent-light wave 15 in the semiconductor member 10 is parallel to the applied electric field $E_{dc}$.

It has been found that by employing the arrangement described, an amplification of the coherent-light wave 15 passed through the semiconductor member 10 occurs. Considering only the photon energy actually fed into and passed through the semiconductor member 10, the semiconductor member 10 operates to increase the amplitude of that photon energy as detected by the photo-sensitive detection system 17. The amount of the increase is a direct function of the intensity of the applied electric field $E_{dc}$.

In order to aid in the understanding of the invention, reference will now be made to the actual frequencies, values and dimensions used in a semiconductor signal translating system constructed according to the embodiment shown in FIG. 1. The particular circuit parameters are given only by way of example and can be changed according to the needs of a given application.

The semiconductor member 10 was constructed of N-type gallium arsinide properly doped to provide a free charge carrier or electron concentration of approximately $10^{15}$ per cc. (cubic centimeter). The member 10 was approximately ½ cm. (centimeter) long, ½ cm. wide and .010 inch thick. The material used for the member 10 exhibited a resistivity in the range of 1 ohm-cm. to 3.7 ohm-cm. and a mobility in the range of 2000 $cm.^2/V$ sec. to 5000 $cm.^2/V$ sec. Indium ohmic contacts 11, 12 were used, and all surface areas of the member 10 except the two edges supporting the contacts 11, 12 were optically polished. The measured resistance between the two ohmic contacts 11, 12 was 100 ohms.

In order to avoid possible damage to the semiconductor member 10 due to temperature effects, a direct current pulse source was used for the battery 13 shown in FIG. 1. The pulse source or pulser had a repetition rate variable between ½ c.p.s. (cycles per second) and 30 c.p.s. and a pulse width variable between 1 msec. (millisecond) and 100 msec. The coherent-light source 14 was a neon-helium gas laser which generated a coherent-infrared-light wave 15 at a wavelength of 1.5 microns with a power level of approximately 5 milliwatts. The semiconductor material used to construct the member 10 was characterized by a band gap energy level higher than that of the incident photon energy. A photo-sensitive detection system similar to the system 17 shown in FIG. 1 was used. An amplification of approximately ten percent considering only the coherent-light wave 15 actually passed through the semiconductor member 10 was obtained.

The efficiency of the semiconductor member 10 as an amplifier depends upon the matching between the received coherent-light wave 15 and the semiconductor member 10. As the amount of power of the coherent-light wave 15 lost by reflection from the surface of the semiconductor member 10 is reduced, increasing the power of the coherent-light wave actually passed through the semiconductor member 10, the efficiency is correspondingly increased.

While the precise mechanism responsible for the operation set forth above is not clearly understood, the existence of the applied electric field $E_{dc}$ perpendicular to the magnetic field H of the coherent-light wave 15 is of significance. It is believed that a type of Hall effect may be involved such that the presence of the magnetic field H of the coherent-light wave 15 acts on the flow of electrons under the influence of the applied electric field $E_{dc}$ to establish oscillations at the frequency of the coherent-light wave 15. These oscillations are about an axis normal to the direction of the applied electric field $E_{dc}$ and the magnetic field H of the coherent-light wave 15. The existence of the oscillations results in the radiation of photon energy at the frequency of the received coherent-light wave 15 which adds to the photon energy otherwise passed through the semiconductor member 10, resulting in a net amplification of the coherent-light wave 15.

Figure 2:
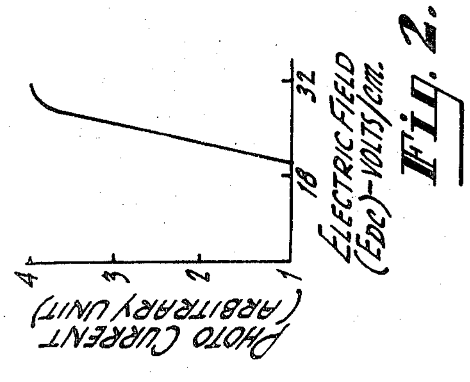
FIG. 2 is a curve useful in describing the operation of the embodiment shown in FIG. 1.

The amount of amplification was found, as predicted, to be directly dependent on the intensity of the applied electric field $E_{dc}$. FIG. 2 is a curve showing the photo-current in arbitrary units versus the applied electric field $E_{dc}$ in volts/cm. actually obtained with the circuit parameters referred to above. A linear increase in the photo-current for an increase in the applied electric field $E_{dc}$ from approximately 20 volts/cm. to approximately 30 volts/cm. is indicated. It follows, therefore, that by varying the intensity of the applied electric field $E_{dc}$ so as to operate the semiconductor member 10 over a linear portion of the response curve as shown in FIG. 2, modulation or a similar control of the coherent-light wave 15 is possible.

Figure 3:
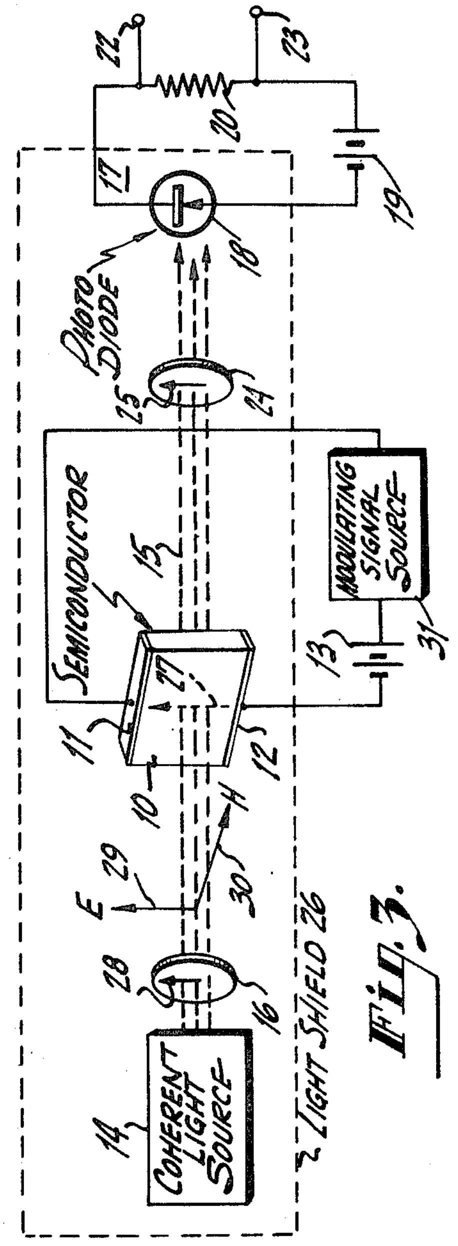
FIG. 3 is a schematic diagram of a further embodiment of a semiconductor signal translating system constructed according to the invention.

FIG. 3 shows the use of the signal translating system of the invention as a modulator. The overall structural arrangement remains as shown in FIG. 1 with the addition of a modulating signal source 31 in series with the battery 13. The modulating signal source 31 may take the form of a simple on-off control. Alternatively, the source 31 can provide an alternating current signal, a square wave signal or any other suitable signal carrying desired signal information. The modulating signal source 31 serves to vary the intensity of the applied electric field $E_{dc}$ in accordance with the modulating signal, resulting in the modulation of the coherent-light wave 15 by the modulating signal in the manner discussed above.

In suggesting that the operation is explainable by a Hall-effect theory, it was predicted that the operation of a semiconductor member under the influence of an applied direct current electric field and an orthogonal light-frequency magnetic field of a polarized coherent-light source would produce a Hall electric field at the same light frequency as that of the coherent-light wave but with a change in polarization. It was found that the operation of the invention using the circuit parameters cited above by way of example did, in fact, result in a polarization change in the electric field of the coherent-light wave 15. The semiconductor member 10 can, therefore, be operated as a light on-off control. The modulating signal source 31 shown in FIG. 3 can be arranged with the battery 13 to supply a square wave pulse. In the absence of the pulse, no electric field $E_{dc}$ is applied to the semiconductor member 10. The coherent-light wave 15 as passed by the semiconductor member 10 exhibits a particular polarization. In the presence of the pulse, a given electric field $E_{dc}$ is applied to the semiconductor member 10, resulting in a change in the polarization of the coherent-light wave 15.

The plane of polarization of the polarizer 24 shown in FIG. 3 is determined so that, for the polarization of the coherent-light wave 15 in the absence of the applied electric field $E_{dc}$, the polarizer 24 absorbs the coherent-light wave 24 and little or no coupling of energy takes place between the coherent-light wave 15 and the photo-sensitive detection system 17. Upon the application of the electric field $E_{dc}$ to the semiconductor member 10, the coherent-light wave 15 changes its polarization in the proper direction to cause the coherent-light wave 15 to be passed by the polarizer 24.

Reference has been made to the operation of the invention with a coherent-light source. The operation of the invention is not intended to be limited for use with light frequencies but can be operated at frequencies including submillimeter wavelengths. At frequencies below light frequencies, suitable waveguide and other microwave techniques can be used to direct the signal to and through the semiconductor member.

What is claimed is:

1. In combination:

a member constructed of one type of a particular semiconductor material including an excess of free charge carriers, wherein said particular semiconductor material is characterized by being substantially transparent to electromagnetic energy of a given frequency passing therethrough, and which in the presence of said electromagnetic energy passing therethrough in a first direction with a magnetic component vector of said electromagnetic energy polarized in a second direction perpendicular to said first direction and in the presence of an electric field through said semiconductor material in a third direction perpendicular to both said first and second directions is further characterized by generating additional photons of electromagnetic energy of said given frequency in an amount which is proportional to the product of said magnetic component vector and the strength of said electric field, means including ohmic contacts on said semiconductor material for applying said electric field in said third direction, and means for applying said electromagnetic energy to and through said semiconductor material in said first direction with a magnetic component vector in said second direction, whereby said additional photons are generated within said semiconductor material.

2. The combination defined in claim 1, wherein said applied electromagnetic energy is linearly polarized with its entire magnetic component substantially in said second direction and its entire electric component substantially in said third direction.

3. The combination defined in claim 1, wherein said means for applying said electric field includes means for altering the strength of said electric field.

4. The combination defined in claim 1, wherein said means for applying said electric field includes a modulating signal source.

5. The combination defined in claim 1, wherein said means for applying said electromagnetic energy is a coherent light source.

6. The combination defined in claim 1, further including means for detecting the intensity of electromagnetic energy emerging from said semiconducting material.

7. The combination defined in claim 1, wherein said semiconductor material is gallium arsenide.

References Cited

UNITED STATES PATENTS

| | | | |
|---|---|---|---|
| 2,692,950 | 10/1954 | Wallace | 250—199 |
| 2,743,322 | 4/1956 | Pierce et al. | 330—5 |
| 2,869,001 | 1/1959 | Welker | 307—88.5 |
| 3,102,959 | 9/1963 | Diemer | 250—199 |
| 3,121,203 | 2/1964 | Heywang | 250—199 |
| 3,194,965 | 7/1965 | Ruff et al. | 250—199 |
| 3,215,841 | 11/1965 | Fork | 250—199 |
| 3,234,475 | 2/1966 | Giordmaine et al. | 250—199 |
| 3,245,314 | 4/1966 | Dillon | 250—199 X |
| 3,247,765 | 4/1966 | Cocca et al. | 250—199 X |

OTHER REFERENCES

Kromer, Proc. I.R.E., March 1959, pp. 397–406, pp. 397 and 404–406 relied on, TK 5700.17, 330–5.

Saito et al. Electronics, vol. 36, No. 1, January 1963, pp. 82–85, TK 7800.E58, 331–94.5.

ROBERT L. GRIFFIN, Primary Examiner

BENEDICT V. SAFOUREK, Assistant Examiner

U.S. Cl. X.R.

332—7.51; 350—160